(12) United States Patent
Lutz et al.

(10) Patent No.: US 9,916,130 B2
(45) Date of Patent: Mar. 13, 2018

(54) APPARATUS AND METHOD FOR VECTOR PROCESSING

(71) Applicant: ARM LIMITED, Cambridge (GB)

(72) Inventors: David Raymond Lutz, Austin, TX (US); Neil Burgess, Austin, TX (US)

(73) Assignee: ARM Limited, Cambridge (GB)

( * ) Notice: Subject to any disclaimer, the term of this patent is extended or adjusted under 35 U.S.C. 154(b) by 278 days.

(21) Appl. No.: 14/564,708

(22) Filed: Dec. 9, 2014

(65) Prior Publication Data

US 2016/0124905 A1 May 5, 2016

Related U.S. Application Data

(60) Provisional application No. 62/074,149, filed on Nov. 3, 2014.

(51) Int. Cl.
*G06F 7/483* (2006.01)
*G06F 7/499* (2006.01)
(Continued)

(52) U.S. Cl.
CPC ............. *G06F 7/483* (2013.01); *G06F 5/012* (2013.01); *G06F 7/38* (2013.01); *G06F 7/48* (2013.01); *G06F 7/4991* (2013.01); *G06F 7/49915* (2013.01); *G06F 7/49921* (2013.01); *G06F 7/49942* (2013.01); *G06F 7/507* (2013.01); *G06F 9/3001* (2013.01); *G06F 9/30014* (2013.01); *G06F 9/3016* (2013.01); *G06F 9/30018* (2013.01); *G06F 9/30025* (2013.01); *G06F 9/30036* (2013.01); *G06F 9/30112* (2013.01); *G06F 9/30185* (2013.01); *G06F 9/30192* (2013.01); *G06F 9/3885* (2013.01); *G06F 11/3476* (2013.01); *G06F 11/3636* (2013.01); *G06F 11/3648* (2013.01); *G06F 17/16* (2013.01); *H03M 7/12* (2013.01); *H03M 7/24* (2013.01); *G06F 7/506* (2013.01); *G06F 11/3404* (2013.01); *G06F 11/348* (2013.01); *G06F 11/3644* (2013.01); *G06F 2201/865* (2013.01); *G06F 2207/483* (2013.01)

(58) Field of Classification Search
CPC ... G06F 7/483; G06F 7/7499; G06F 7/749947
See application file for complete search history.

(56) References Cited

U.S. PATENT DOCUMENTS

| 7,873,812 B1* | 1/2011 | Mimar | G06T 1/20 712/2 |
| 2002/0059355 A1* | 5/2002 | Peleg | G06F 7/4812 708/603 |

(Continued)

*Primary Examiner* — Chuong D Ngo
(74) *Attorney, Agent, or Firm* — Nixon & Vanderhye P.C.

(57) ABSTRACT

An apparatus comprises processing circuitry for performing, in response to a vector instruction, a plurality of lanes of processing or respective data elements with at least one operand vector to generate corresponding result data elements of a result vector. The processing circuitry may support performing at least two of the lanes of processing with different rounding modes for generating rounding values for the corresponding result data elements of the result vector. This allows two or more calculations with different rounding modes to be executed in response to a single instruction, to improve performance.

9 Claims, 4 Drawing Sheets

(51) Int. Cl.
*G06F 9/30* (2006.01)
*G06F 17/16* (2006.01)
*H03M 7/12* (2006.01)
*H03M 7/24* (2006.01)
*G06F 11/34* (2006.01)
*G06F 11/36* (2006.01)
*G06F 5/01* (2006.01)
*G06F 7/38* (2006.01)
*G06F 7/48* (2006.01)
*G06F 7/507* (2006.01)
*G06F 9/38* (2018.01)
*G06F 7/506* (2006.01)

(56) References Cited

U.S. PATENT DOCUMENTS

| | | | |
|---|---|---|---|
| 2003/0167460 A1* | 9/2003 | Desai | G06F 1/3228 717/151 |
| 2005/0144212 A1* | 6/2005 | Simkins | G06F 15/7867 708/490 |
| 2006/0041610 A1* | 2/2006 | Hokenek | G06F 7/5443 708/620 |
| 2006/0101107 A1* | 5/2006 | Dhong | G06F 7/49947 708/524 |
| 2013/0212353 A1* | 8/2013 | Mimar | G06F 9/345 712/4 |

* cited by examiner

```
SET    FPCR  Rmode = RNE
FADD   R3, R2, R1
SET    FPCR  Rmode = RP
FADD   R4, R2, R1
SET    FPCR  Rmode = RM
FADD   R5, R2, R1
SET    FPCR  Rmode = RZ
FADD   R6, R2, R1
```

FIG. 3

```
SET  VP (RNE, RP, RM, RZ)
VFADD  V3, V2, V1
```

FIG. 4

APPARATUS AND METHOD FOR VECTOR PROCESSING

BACKGROUND

The application claims the benefit of U.S. Provisional Application No. 62/074,149, filed 3 Nov. 2014, the entire contents of which is hereby incorporated by reference.

Technical Field

The present technique relates to the field of data processing. More particularly, it relates to vector processing.

Technical Background

Some data processing apparatuses may support vector processing in which at least one operand vector comprising multiple data elements is processed in response to a vector instruction, to generate a result vector comprising multiple data elements. For example, this may help to improve performance by allowing multiple data values to be processed in response to a single instruction.

SUMMARY

Viewed from one aspect, an apparatus is provided comprising:

processing circuitry to perform, in response to a vector instruction, a plurality of lanes of processing on respective data elements of at least one operand vector to generate corresponding result data elements of a result vector;

wherein the processing circuitry supports performing at least two of said plurality of lanes of processing with different rounding modes for generating rounded values for the corresponding result data elements of the result vector.

Viewed from another aspect, an apparatus is provided comprising:

processing means for performing, in response to a vector instruction, a plurality of lanes of processing on respective data elements of at least one operand vector to generate corresponding result data elements of a result vector;

wherein the processing means supports performing at least two of said plurality of lanes of processing with different rounding modes for generating rounded values for the corresponding result data elements of the result vector.

Viewed from a further aspect, a data processing method is provided comprising:

performing, in response to a vector instruction, a plurality of lanes of processing on respective data elements of at least one operand vector to generate corresponding result data elements of a result vector;

wherein at least two of said plurality of lanes of processing are performed with different rounding modes for generating rounded values for the corresponding result data elements of the result vector.

Viewed from another aspect, an apparatus is provided comprising:

processing circuitry to perform a plurality of lanes of processing in response to an arithmetic instruction, each lane of processing for generating a result data element of a result vector by performing an arithmetic operation on a corresponding data element of at least one operand vector; and a storage location to store control information specifying, separately for each of at least two of said lanes of processing performed in response to said arithmetic instruction, a type of arithmetic operation to be performed to generate the result data element for that lane.

Viewed from another aspect, an apparatus is provided comprising:

processing means for performing a plurality of lanes of processing in response to an arithmetic instruction, each lane of processing for generating a result data element of a result vector by performing an arithmetic operation on a corresponding data element of at least one operand vector; and storage means for storing control information specifying, separately for each of at least two of said lanes of processing performed in response to said arithmetic instruction, a type of arithmetic operation to be performed to generate the result data element for that lane.

Viewed from another aspect, a data processing method is provided comprising:

in response to an arithmetic instruction, reading control information specifying, separately for each of at least two of a plurality of lanes of processing to be performed in response to the arithmetic instruction, a type of arithmetic operation to be performed for each lane; and performing said plurality of lanes of processing with said at least two of said lanes generating a result data element of a result vector from a corresponding data element of at least one operand vector by performing the type of arithmetic operation specified by the control information for that lane.

Further aspects, features and advantages of the present technique will be apparent from the following description of examples, which is to be read in conjunction with the accompanying drawings.

BRIEF DESCRIPTION OF THE DRAWINGS

FIG. 3 shows a comparative example of an instruction sequence;

FIG. 4 shows an example of an instruction sequence for generating the same result as in FIG. 3 using the technique shown in FIG. 2.

DESCRIPTION OF EXAMPLES

Figure 1:
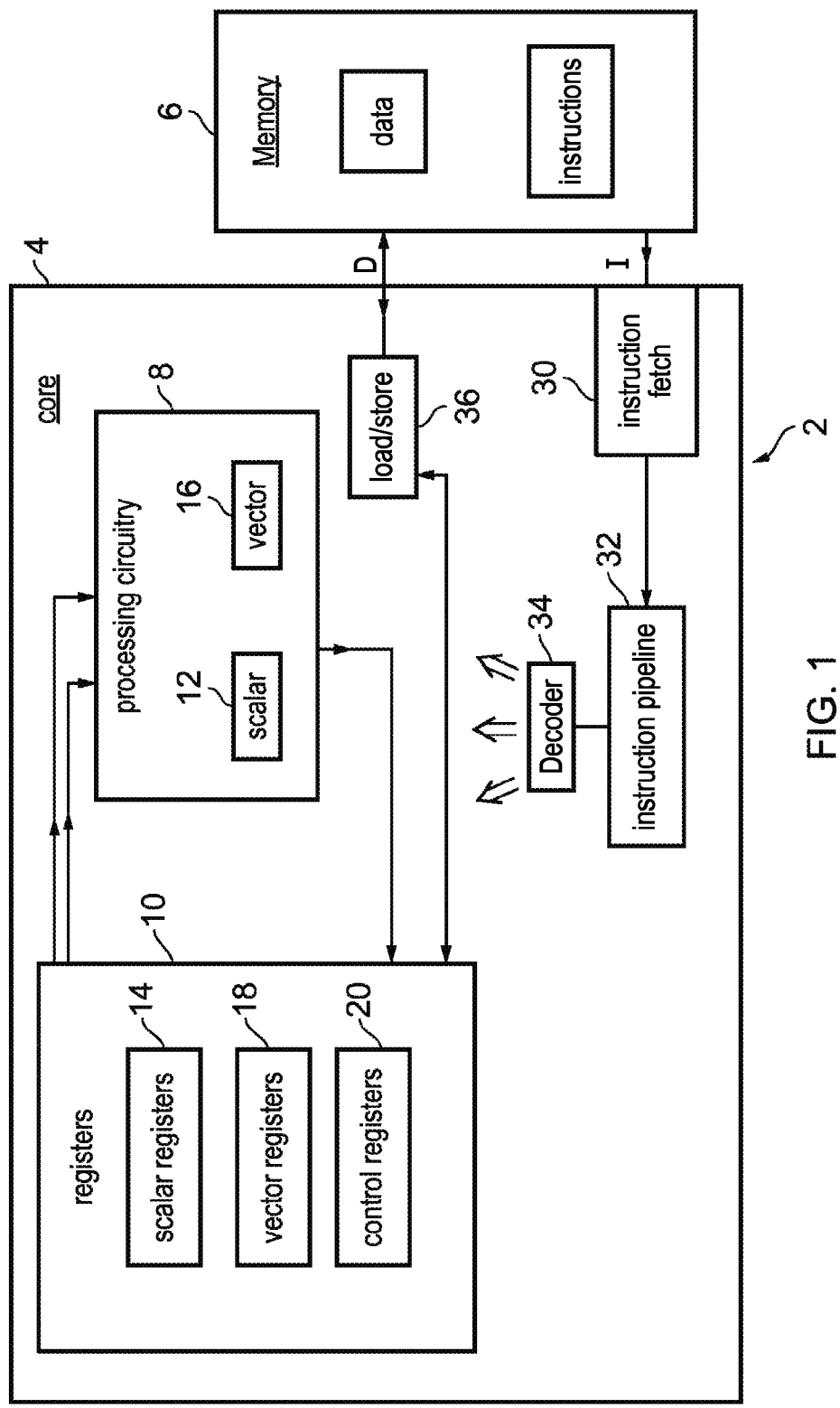
FIG. 1 schematically illustrates an example of a data processing apparatus supporting vector processing.

An apparatus may comprise processing circuitry to perform, in response to a vector instruction, a plurality of lanes of processing on respective data elements of at least one operand vector to generate corresponding result data elements of a result vector. The processing circuitry may support performing at least two of the lanes of processing with different rounding modes for generated rounded values for the corresponding result data elements of the result vector.

A rounded result value may be generated according to several different rounding modes. Typically vector processing (also known as single instruction multiple data or SIMD processing) has been used to perform a number of identical processing operations using different data, so one might expect it would be enough to specify a single rounding mode for the vector processing as a whole. It may seem counter-intuitive that it would be useful or desirable to use different rounding modes for different lanes of processing performed in response to a vector instruction. However, the inventors recognised that there are circumstances in which a number of processing operations with different rounding modes are required, with relatively few processing operations per rounding mode. For example, a software library may require the same calculation to be carried out with a given set of input values using several different rounding modes (e.g. to investigate the actual value of a processing result if it is more precise than can be represented in the result format). By providing processing circuitry capable of executing a vector instruction with two or more different rounding modes for different lanes of vector processing, such calculations can be carried out with a single vector instruction. Also, sometimes the number of calculations required using a single rounding mode may be less than the total number of data elements of the vector. If only a single rounding mode could be used for all lanes, then this may result in some lanes of processing being unused. By allowing different rounding modes to be used for different lanes of processing in response to the same vector instruction, the lanes which are not used for calculations with one rounding mode could be used to perform calculations with a different rounding mode, which would otherwise require a separate instruction. Therefore, this technique allows a required set of processing operations to be performed with fewer instructions, to improve performance, reduce code size and reduce power consumption.

Vector processing with different rounding modes per lane (referred to as "per-lane rounding" below) need not be supported for all instructions. In some cases, per-lane rounding may only be supported for a subset of instructions. For example, the processing circuitry may support performing per-lane rounding for a floating-point vector instruction, but need not support per-lane rounding for integer or fixed-point vector instructions. A floating-point vector instruction may be considered to be any instruction for which either the operand vector(s) or the result vector has data elements which represent floating-point values, including instructions which convert between a floating-point format and another number format. Performing different rounding modes for different lanes of processing is particularly useful for floating-point vector instructions because the IEEE-754 standard for floating-point numbers may require rounding to be performed for most floating-point operations. Nevertheless, per-lane rounding could also be used for other types of vector instructions such as fixed-point or integer instructions. For example when converting from one fixed-point format to another fixed-point format, the number represented in the first format may not be exactly representable using the second format, and in this case rounding may be required even if the second format is a fixed-point or integer format.

In one example, the processing circuitry may be responsive to control information which specifies the rounding mode to be used for each lane, in order to generate the rounded value for the corresponding result data element of each lane according to the rounding mode specified by the control information. The control information may be programmable so that the programmer can specify the rounding modes to be used for each lane.

The processing circuitry may have rounding circuitry which generates a rounding increment for each lane based on the data values being processed by that lane and the rounding mode specified for that lane by the control information. The rounding circuitry could be provided separately within each processing unit for processing each lane, or could be provided as a general control block shared between lanes which outputs a rounding increment for each lane.

The control information could be represented in a number of different ways. For example, the control information could in some cases be encoded within the instruction as an immediate value. However, to save encoding space within an instruction set architecture, the control information may be stored in a control storage location. For example, the control storage location could be a register. The register used to store the control information could be a predetermined register which is used by default for each instruction for which per-lane rounding is supported, or the register could be specified using a register specifier within the encoding of a vector instruction so that different control registers could be selected for different instructions.

Hence, when executing a vector instruction for which per-lane rounding is supported the processing circuitry may refer to the control storage location to read out the control information specifying the rounding mode for each lane and each lane of processing may then respond to a respective part of the control information to identify a rounding mode for that lane. There may be several ways of representing the rounding mode to be used by each lane within the control information. For example, if certain patterns of selected rounding modes for each lane are expected to be used frequently, then such patterns could be identified by a predetermined identifier.

However, a more general approach may be to provide a control storage location which has a number of control fields each for storing control information for controlling a corresponding lane of processing. For at least one type of vector instruction, the processing circuitry for processing a given lane of vector processing may refer to the corresponding control field in order to determine how to process the corresponding data elements of the operand vector to generate the result data element, and the corresponding control field for a given lane of processing may include a rounding mode value specifying the rounding mode to be used for that lane. In this way, each lane of processing may have its rounding mode set independently from other lanes by adjusting the rounding mode value within the control field corresponding to that lane.

In some examples, each rounding mode that is supported by the processing circuitry may correspond to a particular encoding of the rounding mode value in the control field for a given lane of processing. In other examples, not all of the rounding modes supported in hardware may be representable by the rounding mode value (i.e. not all the available rounding modes may be available for selection on a lane by lane basis). There may be other ways of specifying rounding modes in addition to the lane-by-lane representation within the control storage location.

For example, one of the possible encodings of the rounding mode value may be allocated as a default value, so that when the rounding mode value has the default value then the processing circuitry may perform the corresponding lane of processing using a default rounding mode. A further control storage location may store information indicating the default rounding mode. In this way, even if there is not enough space in the rounding mode value field for representing all available rounding modes, other rounding modes which do not have a corresponding encoding of the rounding mode value can still be selected by setting the further control storage location to indicate one of these rounding modes as the default rounding mode, and setting the rounding mode value for some of the lanes of processing to indicate the default rounding mode. This can help to reduce the size of the rounding mode value if control register space is restricted. Also, this approach may be useful for compatibility with legacy code which may set the rounding mode for all vector lanes using the further control storage location.

The rounding mode value does not need to be interpreted in the same way for all instructions. As mentioned above, not all instructions may support the lane-by-lane rounding. Hence, the rounding field used to indicate the rounding mode value in the control field may indicate different information for different types of instructions. For at least one type of instruction (e.g. floating point vector instructions), the rounding field may indicate the rounding mode to be used for the corresponding lane, but for at least one other type of instruction (e.g. integer or fixed-point vector instructions) the rounding field may specify other information. For example, the other information could indicate whether the corresponding lane of processing is to generate the result data element with non-saturating or saturating arithmetic, or could indicate which portion of the results generated by that lane of processing is to be represented by the corresponding result data element, or could indicate which type of arithmetic or logical operation should be performed for that lane. In this way, information can be specified on a lane-by-lane basis to control different lanes of processing in different ways, without needing to specify this information in the instruction encoding itself. Also, by reusing the rounding field for other purposes for instructions for which per-lane rounding is not required, it is not necessary to provide a second field of the control storage location for this purpose, to save register space for example.

In one example, the control storage location may, in addition to the rounding mode value, include element selection information for identifying one or more selected elements of the at least one operand vector such that the processing circuitry generates corresponding result data elements for at least the lanes of processing corresponding to the selected elements indicated by the element selection information. For example, there may not always be enough data to fill a complete vector and so on some occasions only some of the elements of the input vectors may need to be processed. By identifying the selected elements using the element selection information, inactive lanes of processing which correspond to non-selected elements need not be performed, or a processing unit corresponding to an inactive lane may be power gated, placed in a fixed state, or provided with zero inputs, to reduce toggling of states of internal components of the processing unit, to reduce power consumption. The element selection information could in one example comprise a vector length indication which indicates the length of an active portion of a vector, with a number of elements indicated by the vector length being processed as the selected data elements (e.g. a number of least significant elements of the vector). Alternatively, to allow discrete elements to be selected, the element selection information may comprise mask information which identifies for each element whether it is an active element or an inactive element.

For example, the control storage location may include a number of control fields as discussed above and each control field may include information identifying whether the corresponding lane of processing is an active lane which is to generate the corresponding result data element based on the corresponding data element of the at least one operand vector or an inactive lane for which the corresponding result data element is independent of the corresponding data element of the at least one operand vector. For those lanes which are inactive, the result data element could be generated with a default value such as zero, or a value calculated assuming input element values of zero, or the corresponding portion of a destination register to be written with the result value may remain unchanged.

The control storage location for storing the active/inactive lane information may be reused to also indicate the rounding mode values for each lane. This can be useful since in some implementations there may be unused bit space in this control storage location. For example, the active/inactive lane information may only require one bit per data element, but if a register of a certain fixed size is used as the control storage location then there may not be enough mask bits to fill the whole register. The spare bits may be reused to indicate the rounding information.

The vector instruction may be any instruction which controls the processing circuitry to perform multiple lanes of processing on respective data elements of at least one operand vector. The vector instruction may be processed in different ways. Some systems may process vector instructions using processing circuitry which executes each lane of processing in sequence so that one lane is executed after the other. However, other implementations may provide a number of processing units for performing at least some of the plurality of lanes of vector processing in parallel, to improve performance. Sometimes, all of the elements of a vector may be processed in parallel. However, it is also possible to support vectors having a greater number of data elements than can be processed in parallel by the hardware. For example, the processing circuitry may have M processing units (M>1), and if the vector instruction requires more than M lanes of processing then the lanes of processing may be performed in several passes of the processing units. Hence, the vector size may be independent of the hardware provided in the processing circuitry so that it is possible to process vectors larger than the hardware provided.

In another example, an apparatus may have processing circuitry to perform a plurality of lanes of processing in response to an arithmetic instruction, with each lane of processing for generating a result data element of a result vector by performing an arithmetic operation on a corresponding data element of at least one operand vector. The apparatus may also have a storage location to store control information specifying, separately for each of at least two of the lanes of processing performed in response to said arithmetic instruction, a type of arithmetic operation to be performed to generate the result data element for that lane.

In vector (SIMD) processing, the type of operation to be performed is often specified by the instruction encoding, and would be the same for each lane. By instead using a storage location to store control information specifying, separately for at least two of the lanes, a type of arithmetic operation to be performed to generate the result data element for that lane, this allows a number of different types of arithmetic operation to be performed in fewer instructions, without wasting instruction encoding space for encoding each lane's type of arithmetic operation in the instruction itself (instruction encoding space is typically at a premium in many instruction set architectures). Hence, in response to a single arithmetic instruction, a number of different manipulations of the data elements of the at least one operand vector can be performed in parallel using a different type of arithmetic operation in each lane.

The control information in the storage location need not mean the same thing for all arithmetic instructions. For example, for a first arithmetic instruction, the control information may specify one property of the arithmetic operation, while for a second arithmetic instruction, the control information may specify a different property. In this way, the meaning of the control information may vary on an instruction-by-instruction basis.

In general, the different "types" of arithmetic operation indicated by the control information may differ in any way which causes a different manipulation to be performed on the data element(s) of the at least one operand vector in order to generate the result data element for at least two of the lanes. Examples of properties of the arithmetic operation which may be specified for a given lane by the control information may include:

which particular arithmetic operation is to be performed to generate the result data element for that lane (e.g. add or subtract);

a rounding mode to be used in the arithmetic operation to generate a rounded value for the result data element for that lane; and whether the arithmetic operation uses saturating or non-saturating arithmetic to generate the result data element for that lane.

In some examples, the control information may specify the type of arithmetic operation separately for only some of the plurality of lanes. For example, the lanes could be divided into several subsets or banks of lanes, with each subset or bank of lanes having a corresponding parameter of the control information specifying the type of arithmetic operation to be performed for the lanes within that subset or bank. Therefore, it is not essential for every lane to have a separate indication of the type of arithmetic operation.

However, in other examples the control information may specify the type of arithmetic operation separately for each of the plurality of lanes. This may provide more freedom to select different operations to be applied to each element, which may help to reduce the amount of processing required to implement a series of operations. Not only does this allow a greater number of different types of operations to be performed in response to a single instruction, but the ability to specify the type of arithmetic operation separately for each lane can also help to reduce the amount of processing required even when relatively few types of operations are needed. This is because specifying the operation separately for each lane means that the data elements to be processed using a particular type of arithmetic operation can be located at any position within the operand vector(s), so that it is not necessary to perform additional element rearrangement operations to ensure that the data elements to be processed using the same arithmetic operation are placed at positions corresponding to the same subset of lanes.

Floating-Point

Floating-point (FP) is a useful way of approximating real numbers using a small number of bits. The IEEE 754-2008 FP standard proposes multiple different formats for FP numbers, but three of these are binary 64 (also known as double precision, or DP), binary 32 (also known as single precision, or SP), and binary 16 (also known as half precision, or HP). The numbers 64, 32, and 16 refer to the number of bits required for each format.

Representation

FP numbers are quite similar to the "scientific notation" taught in science classes, where instead of negative two million we'd write $-2\ 0.0 \times 10^6$. The parts of this number are the sign (in this case negative), the significand (2.0), the base of the exponent (10), and the exponent (6). All of these parts have analogs in FP numbers, although there are differences, the most important of which is that the constituent parts are stored as binary numbers, and the base of the exponent is always 2.

More precisely, FP numbers consist of a sign bit, some number of biased exponent bits, and some number of fraction bits. In particular, the DP, SP and HP formats consist of the following bits:

TABLE 1

| format | sign | exponent | fraction | exponent bias |
|---|---|---|---|---|
| DP [63:0] | 63 | 62:52 (11 bits) | 51:0 (52 bits) | 1023 |
| SP [31:0] | 31 | 30:23 (8 bits) | 22:0 (23 bits) | 127 |
| HP [15:0] | 15 | 14:10 (5 bits) | 9:0 (10 bits) | 15 |

The sign is 1 for negative numbers and 0 for positive numbers. Every number, including zero, has a sign.

The exponent is biased, which means that the true exponent differs from the one stored in the number. For example, biased SP exponents are 8-bits long and range from 0 to 255. Exponents 0 and 255 are special cases, but all other exponents have bias 127, meaning that the true exponent is 127 less than the biased exponent. The smallest biased exponent is 1, which corresponds to a true exponent of −126. The maximum biased exponent is 254, which corresponds to a true exponent of 127. HP and DP exponents work the same way, with the biases indicated in the table above.

SP exponent 255 (or DP exponent 2047, or HP exponent 31) is reserved for infinities and special symbols called NaNs (not a number). Infinities (which can be positive or negative) have a zero fraction. Any number with exponent 255 and a nonzero fraction is a NaN. Infinity provides a saturation value, so it actually means something like "this computation resulted in a number that is bigger than what we can represent in this format." NaNs are returned for operations that are not mathematically defined on the real numbers, for example division by zero or taking the square root of a negative number.

Exponent zero, in any of the formats, is reserved for subnormal numbers and zeros. A normal number represents the value:

$$-1^{sign} \times 1.\text{fraction} \times 2^e$$

where e is the true exponent computed from the biased exponent. The term 1.fraction is called the significand, and the 1 is not stored as part of the FP number, but is instead inferred from the exponent. All exponents except zero and the maximum exponent indicate a significand of the form 1.fraction. The exponent zero indicates a significand of the form 0.fraction, and a true exponent that is equal to 1-bias for the given format. Such a number is called subnormal (historically these numbers were referred to as denormal, but modern usage prefers the term subnormal). Numbers with both exponent and fraction equal to zero are zeros.

Table 2 has some example numbers in HP format. The entries are in binary, with characters added to increase readability. Notice that the subnormal entry (4th line of the table, with zero exponent) produces a different significand than the normal entry in the preceding line.

TABLE 2

| sign | 5-bit exponent | 10-bit fraction | 11-bit significand | value |
|---|---|---|---|---|
| 0 | 01111 | 00 0000 0000 | 100 0000 0000 | $1.0 \times 2^0$ |
| 1 | 01110 | 10 0000 0000 | 110 0000 0000 | $-1.1 \times 2^{-1}$ |
| 0 | 00001 | 10 0000 0000 | 110 0000 0000 | $1.1 \times 2^{-14}$ |
| 0 | 00000 | 10 0000 0000 | 010 0000 0000 | $0.1 \times 2^{-14}$ |
| 1 | 11111 | 00 0000 0000 | | −infinity |
| 0 | 11111 | 00 1111 0011 | | NaN |

A large part of the complexity of FP implementation is due to subnormals, therefore they are often handled by microcode or software. Some implementations handle subnormals in hardware, speeding up these operations by a factor of 10 to 100 compared to a software or microcode implementation.

Integers, Fixed-Point, Floating-Point

The FP way of handling signs is called sign-magnitude, and it is different from the usual way integers are stored in the computer (two's complement). In sign-magnitude representation, the positive and negative versions of the same number differ only in the sign bit. A 4-bit sign-magnitude integer, consisting of a sign bit and 3 significand bits, would represent plus and minus one as:

+1=0001
−1=1001

In two's complement representation, an n-bit integer i is represented by the low order n bits of the binary n+1-bit value $2^n+i$, so a 4-bit two's complement integer would represent plus and minus one as:

+1=0001
1=1111

The two's complement format is practically universal for signed integers because it simplifies computer arithmetic.

A fixed-point number looks exactly like an integer, but actually represents a value that has a certain number of fractional bits. Sensor data is often in fixed-point format, and there is a great deal of fixed-point software that was written before the widespread adoption of FP. Fixed-point numbers are quite tedious to work with because a programmer has to keep track of the "binary point", i.e. the separator between the integer and fractional parts of the number, and also has to constantly shift the number to keep the bits in the correct place. FP numbers don't have this difficulty, so it is desirable to be able to convert between fixed-point numbers and FP numbers. Being able to do conversions also means that we can still use fixed-point software and data, but we are not limited to fixed-point when writing new software.

Rounding FP Numbers

Most FP operations are required by the IEEE-754 standard to be computed as if the operation were done with unbounded range and precision, and then rounded to fit into an FP number. If the computation exactly matches an FP number, then that value is always returned, but usually the computation results in a value that lies between two consecutive floating-point numbers. Rounding is the process of picking which of the two consecutive numbers should be returned.

There are a number of ways of rounding, called rounding modes; six of these are shown in Table 3:

TABLE 3

| mode | definition | |
|---|---|---|
| RNE | round-to nearest, ties to even | pick the closest value, or if both values are equally close then pick the even value |
| RNA | round to nearest, ties to away | pick the closest value, or if both values are equally close then pick the value farthest away from zero |
| RZ | round to zero | pick the value closest to zero |
| RP | round to plus infinity | pick the value closest to plus infinity |
| RM | round to minus infinity | pick the value closest to minus infinity |
| RX | round to odd | pick the odd value |

The definition doesn't tell us how to round in any practical way. One common implementation is to do the operation, look at the truncated value (i.e. the value that fits into the FP format) as well as all of the remaining bits, and then adjust the truncated value if certain conditions hold. These computations are all based on:

L—(least) the least significant bit of the truncated value
G—(guard) the next most significant bit (i.e. the first bit not included in the truncation)
S—(sticky) the logical OR of all remaining bits that are not part of the truncation Given these three values and the truncated value, we can always compute the correctly rounded value according to Table 4:

TABLE 4

| mode | change to the truncated value |
|---|---|
| RNE | increment if (L&G) | (G&S) |
| RNA | increment if G |
| RZ | none |
| RP | increment if positive & (G | S) |
| RM | increment if negative & (G | S) |
| RX | set L if G | S |

For example, consider multiplying two 4-bit significands, and then rounding to a 4-bit significand.

sig1=1011 (decimal 11)
sig2=0111 (decimal 7)
multiplying yields
sig1×sig2=1001_101 (decimal 77)
L Gss The least significant bit of the truncated 4-bit result is labeled L, the next bit G, and S is the logical OR of the remaining bits labeled s (i.e. S=0|1=1). To round, we adjust our 4-bit result (1001) according to the rounding mode and the computation in the table above. So for instance in RNA rounding, G is set so we return 1001+1=1010. For RX rounding G|S is true so we set L to 1 (it's already 1, so in this case nothing changes) and return 1001.

Rounding Integer and Fixed-Point Numbers

If we convert an FP number to integer or fixed-point we also have to round. The concept is basically the same as FP rounding. An FP number that happens to be an integer always rounds to that integer. All other FP numbers lie between two consecutive integers, and rounding dictates which integer is returned. Unfortunately the rounding logic for integers is somewhat harder because of the differences between two's complement and sign-magnitude form. Incrementing a sign-magnitude number always increases the magnitude, so the incremented number is farther away from zero. The same thing happens for positive two's complement numbers, but negative two's complement numbers become closer to zero when incremented. This means that the rounding logic has to change based on whether the integer is positive or negative. It also means we have to be careful in picking the base value (the value which will be incremented or not). For positive integers, that value is just the truncated FP significand, so 1.37 will have a base value of 1, and a result of either 1 or 2. For negative integers, we again truncate the significand and take the one's complement of the result (one's complement is the original number with all bits inverted), −1.37 is truncated to 1 and then inverted, giving a base value of −2. Everything then works out since we want our result to be either −2 or (when incremented) −1.

To further complicate things, our method of conversion requires some computation to find L, G, and S for negative integers. Correct rounding would require us to complete the two's complement process (invert and add 1) and then compute L, G, and S, but adding that 1 is slow compared to just inverting. Ideally we would like to compute the actual L, G, and S from the original shifted input (i.e., from the input before we've done anything about signs. So the floating-point 1.37 or −1.37 would both be right shifted to the integer 1).

Let L0, G0, and S0 be the least significant bit (lsb), guard and sticky before inverting, and let Li, Gi, and Si be lsb, guard and sticky after inverting, and finally let L, G, and S be the lsb, guard and sticky after inverting and adding 1.

If S0 is zero, then the bits contributing to Si are all ones, and hence S (obtained by adding 1 to those Si bits) is also zero. If S0 is nonzero, then Si is not all ones, and hence S is nonzero. So in all cases S0=S.

If G0 is zero, then Gi is 1, and G is also one except for the case when there is a carry-in from the S bits, which only happens when S0 is zero. If G0 is 1, then Gi is zero, and again G is also one except for the case where there is a carry-in from the S bits, which only happens when S0 is zero. So G=G0 ^ S0.

By very similar logic, L=L0 ^(G0|S0).

Now that we have L, G, and S for both negative and positive integers, we can come up with our rounding rules as shown in Table 5:

TABLE 5

| mode | change to a positive value | change to a negative value |
|------|---------------------------|---------------------------|
| RNE  | increment if (L&G) \| (G&S) | increment if (L&G) \| (G&S) |
| RNA  | increment if G            | increment if (G&S)        |
| RZ   | none                      | increment if (G \| S)     |
| RP   | increment if (G \| S)     | increment if (G \| S)     |
| RM   | none                      | none                      |
| RX   | set L if G \| S           | set L if G \| S           |

Fixed-point numbers round exactly the same way as integers. The rules for unsigned conversions (to integer or fixed-point) are the same as the rules for positive conversions.

Injection Rounding

A faster way to do rounding is to inject a rounding constant as part of the significand addition that is part of almost every FP operation. To see how this works, consider adding numbers in dollars and cents and then rounding to dollars. If we add $1.27
+ $2.35
─────
$3.62

We see that the sum $3.62 is closer to $4 than to $3, so either of the round-to-nearest modes should return $4. If we represented the numbers in binary, we could achieve the same result using the L, G, S method from the last section. But suppose we just add fifty cents and then truncate the result?

1.27
+ 2.35
+ 0.50   (rounding injection)
─────
4.12

If we just returned the dollar amount ($4) from our sum ($4.12), then we have correctly rounded using RNA rounding mode. If we added $0.99 instead of $0.50, then we would correctly round using RP rounding. RNE is slightly more complicated: we add $0.50, truncate, and then look at the remaining cents. If the cents remaining are nonzero, then the truncated result is correct. If there are zero cents remaining, then we were exactly in between two dollar amounts before the injection, so we pick the even dollar amount. For binary FP this amounts to setting the least significant bit of the dollar amount to zero.

Adding three numbers is only slightly slower than adding two numbers, so we get the rounded result much more quickly by using injection rounding than if we added two significands, examined L, G, and S, and then incremented our result according to the rounding mode.

Implementing Injection Rounding

For FP, the rounding injection is one of three different values, values which depend on the rounding mode and (sometimes) the sign of the result.

Both RNA and RNE require us to inject a 1 at the G position (this is like adding $0.50 in our dollars and cents example).

RP and RM rounding depends on the sign as well as the mode. RP rounds positive results up (increases the magnitude of the significand towards positive infinity), but truncates negative results (picking the significand that is closer to positive infinity). Similarly RM rounds negative results up (increasing the magnitude of the significand toward negative infinity), but truncates positive results (picking the significand that is closer to negative infinity). Thus we split RM and RP into two cases: round up (RU) when the sign matches the rounding direction, and truncation (RZ) when the sign differs from the rounding injection. For RU cases we inject a 1 at the G-bit location and at every location that contributes logically to S (this is like adding $0.99 in our dollars and cents example).

For RZ and RX modes, and for RP and RM modes that reduce to RZ mode, we inject zeros.

For most of the rounding modes, adding the rounding injection and then truncating gives the correctly rounded result. The two exceptions are RNE and RX, which require us to examine G and S after the addition. For RNE, we set L to 0 if G and S are both zero. For RX we set L to 1 if G or S are nonzero.

fp number are not real numbers

It's tempting to think of FP numbers as being just like real numbers, but they are fundamentally different, even for the most basic properties:

1. They are not associative. For example, in SP we can add 3 numbers and return 1 million or zero, perhaps not what people think of as a rounding error:

$(2^{45}+-2^{45})+2^{20}=2^{20}$ $2^{45}+(-2^{45}+2^{20})=0$

2. They don't obey the distributive laws. Again in SP:

$3,000,001*(4.00001+5.00001)=0x4bcdfe83$ $(3,000,001*4.00001)+$
$(3,000,001*5.00001)=0x4bcdfe82$ and things get even worse in the presence of overflow:

$2^{50}*(2^{78}-2^{77})=2^{127}$ $(2^{50}*2^{78})-(2^{50}*2^{77})=\text{infinity}$ 3. In some implementations, they aren't even commutative unless we are in default NaN mode (a mode that converts all NaNs to a single NaN), because in general nanA+nanB !=nanB+nanA. Numeric adds and multiplies are commutative.

4. Because of IEEE NaN rules, there are no multiplicative or additive identities. One and zero work as identities for numeric values.

One useful way to think of FP numbers is to consider them to be very long fixed-point numbers in which at most a few (53 for DP) consecutive bits can be nonzero. For example, non-infinite DP numbers can have the first bit of the significand in any of 2046 places, and that first bit is followed by 52 other significant bits, and there is a sign bit, so any finite DP number can be represented as a 2046+52+1=2099-bit fixed point number. Examined this way it becomes very obvious that adding two FP numbers does not, in general, result in another FP number: the result of the addition has to be rounded so that it becomes an FP number.

FIG. 1 schematically illustrates an example of a data processing apparatus 2 comprising a processor core 4 and a memory 6. In some cases the memory 6 may include a cache or several levels of cache in a hierarchical structure. The core 4 includes processing circuitry 8 for performing data processing operations using data values stored in registers 10. The processing circuitry 8 may include scalar processing circuitry 12 for performing scalar processing operations using data values stored in scalar registers 14 and vector processing circuitry (also known as single instruction multiple data (SIMD) circuitry) 16 for performing vector processing operations using vector data values stored in vector registers 18. The registers 10 may also include control registers 20 for storing various control parameters for controlling processing operations of the processing circuitry 8. Each value stored in the scalar registers comprises a single numeric value which may be a floating-point value, fixed-point value or integer value for example. in contrast, the vector registers 18 store vector values which may support multiple elements within the same operand with each data element being processed separately to generate separate result data elements of a result vector. The vector processing circuitry 16 may support vectors with different sizes of data elements. For example, a value in a 64-bit vector register may for example be treated as a vector of one 64-bit element, two 32-bit elements, four 16-bit elements or eight 8-bit elements. An example of vector processing will be discussed below with respect of FIG. 2. It will be appreciated that in some cases some circuitry could be shared between the scalar processing circuitry 12 and the vector processing circuitry 16. Similarly, in some cases the vector registers 18 may overlap with part of the scalar registers 14. The scalar and vector processing circuitry 12, 16 may include elements such as adders, multipliers, shifters and other processing elements for carrying out arithmetic operations, logical operations or other manipulations of data values stored in the registers to generate result values which are written back to the registers 10.

The core 4 also has an instruction fetch unit 30, instruction pipeline 32, instruction decoder 34, and a load store unit 36. In operation, program instructions may be fetched from the memory 6 by the instruction fetch unit 30 and provided to the instruction pipeline 32. The pipeline 32 may have various pipeline stages including a decode stage, a register rename stage, and an issue stage for example. The pipeline 32 may support out-of-order execution in which program instructions may be executed by the processing circuitry 8 in a different order from the program order in which the instructions are stored in memory. At the appropriate stage of the pipeline, the instructions are decoded by instruction decoder 34 to generate control signals which serve to control operation of the registers 10, processing circuitry 8 and load store unit 36. For example, in response to load/store instructions, the load/store unit 36 may load data from memory 6 and place it in the registers 10, or store data from the registers 10 to memory 6. In response to a data processing instruction, the processing circuitry 8 may be controlled to perform a data processing operation on one or more values read from the registers 10 to generate a result value which is then written back to a destination register. It will be appreciated that the apparatus 2 may include many additional elements and that the representation in FIG. 1 is simplified for conciseness.

Figure 2:
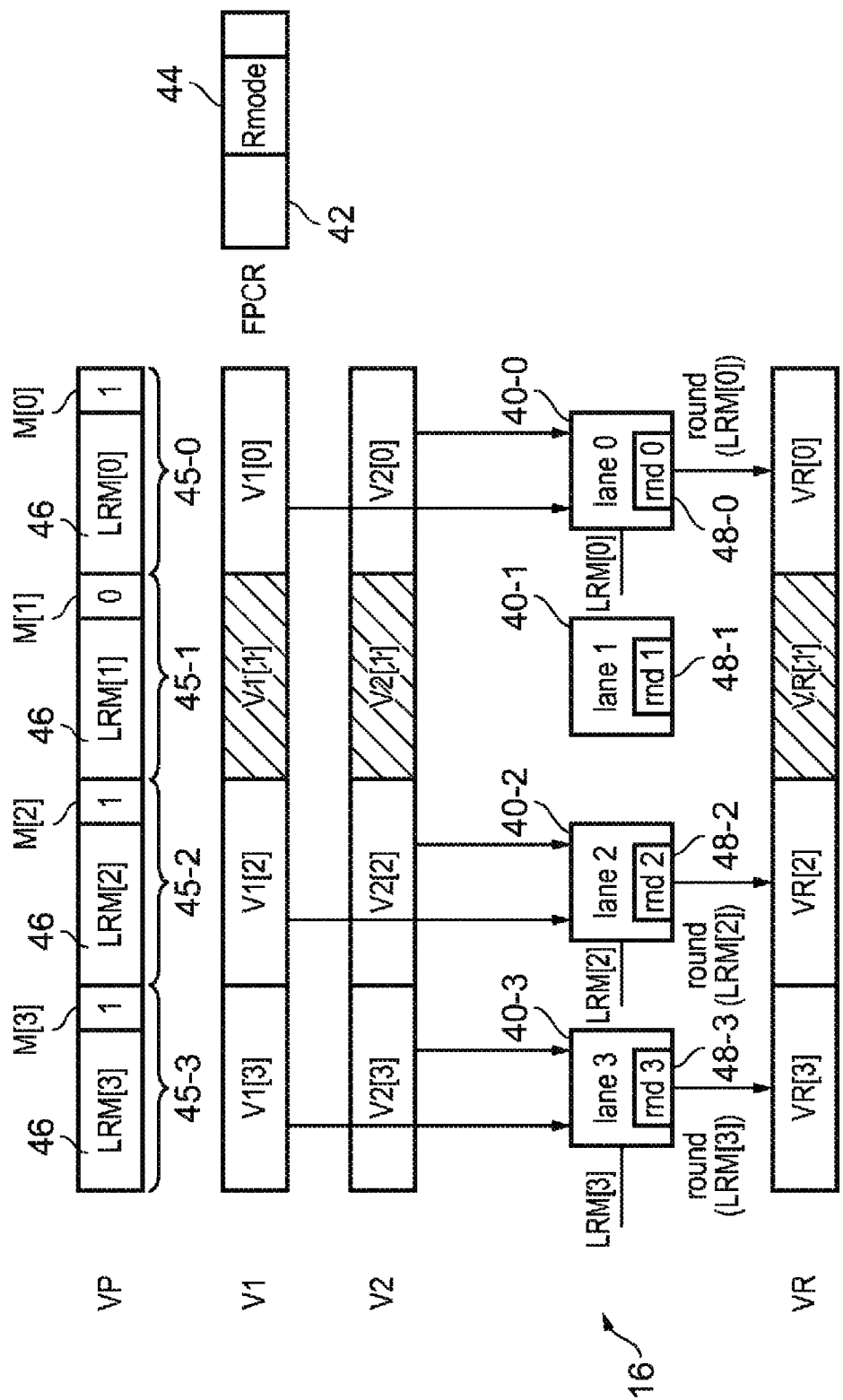
FIG. 2 shows an example of vector processing in which different lanes of processing use different rounding modes to generate a rounded value for the corresponding result data element.

FIG. 2 shows an example of performing vector processing. The vector processing circuitry 16 comprises a number of processing units 40 for providing parallel lanes of processing operating on respective portions of the vector to generate corresponding portions of the result value. In operation, the decoder 34 decodes a vector instruction specifying registers storing one or more operand vectors V1, V2 and a destination register to which a result vector VR is to be written. Some instructions may only specify one operand vector rather than two. For some instructions, one of the operand vectors may be the value previously stored in the destination register. In response to the vector instruction, the processing unit 40 for each processing lane processes the corresponding data elements of the operand vectors, V1, V2 to generate a corresponding result element of the result vector VR. For example, each processing lane may add, subtract or multiply the data elements of the operand vectors, or perform any other manipulation to generate the result (including possible conversions between different number formats).

As shown in FIG. 2, not all the processing lanes need be active for a given vector operation. Control information may be provided in a predicate register VP for controlling the operation of each lane. In some cases the predicate register may be specified by the vector instruction, or alternatively the predicate register could be a default register used for all vector instructions or specified in some other way. As shown in FIG. 2 the predicate register may include control fields 45 each corresponding to one of the lanes of processing. Each control field includes a mask bit M which indicates whether the corresponding lane of processing is an active lane or an inactive lane. For the active lanes, the corresponding result data element is generated in dependence on corresponding data elements of the operand vectors V1, V2. For an inactive lane, the result data element of vector VR for that lane is independent of the corresponding elements of the operand V1, V2. For example, in the example shown in FIG. 2 the mask bit for lane 1 is set to 0 to indicate that lane 1 is an inactive lane, while lanes 0, 2 and 3 are active lanes with the mask bit set to 1. The result data element for inactive lanes can be generated in different ways. For example, the result data element for an inactive lane could be set to a predetermined value (e.g. zero), or could retain the value which the corresponding data element of the destination register had before the vector instruction was executed. Specifying active/inactive lanes may be useful for packing the results of multiple different vector instructions into a single value so that a particular vector instruction may only fill some elements of the destination register and may leave other elements unchanged. Predicate setting instructions may be used to set the mask bits M[0]-M[3] of the predicate register VP, prior to execution of a corresponding vector instruction.

It will be appreciated that the use of mask bits is merely an example, and there are other ways of representing which lanes are active lanes and which lanes are inactive. For example, the predicate register could store a vector length parameter indicating a number of active elements, with the processing circuitry processing as active lanes the data elements within the least significant lanes up to the indicated length. For example a vector length of 2 could indicate that the least significant 2 elements should be processed.

As explained above, for some processing operations it may be required to round the result to a value representable in the result format. This is particularly the case for floating-point operations but may also occur for some integer or fixed-point operations especially when there is a conversion from one format to another, when a value representable in the first format may not be exactly representable in the second format. Hence, for some instructions, rounding may be required in each lane of vector processing.

There may be different ways of indicating the rounding mode to be used. Some instructions may specify a particular rounding mode in the instruction encoding. However, this uses up encoding space for indicating rounding modes which may reduce the number of other types of instructions that can be included in the instruction set. Also, one of the control registers 20 may be a floating point control register (FPCR) 42 for storing information for controlling floating-point processing, including a rounding mode value 44 setting a default rounding mode to be used by each lane of vector processing. However, it can be relatively slow to set the floating point control register, especially if it is required to calculate a number of values with different rounding modes. For example some libraries may wish to calculate the same arithmetic operation with several different rounding modes in order to investigate the true value of the result of the arithmetic operation. As shown in FIG. 3, in order to calculate a result of adding scalar operands R1, R2 using four different rounding modes, this would require four control setting instructions (SET) to set the rounding mode parameter 44 in the floating point control register 42 to the appropriate value for each rounding mode (FADD), and four add instructions to perform an addition using the specified rounding mode after each control setting instruction.

These issues can be avoided by providing the vector processing circuitry 16 with support for performing two or more of the lanes of processing 40 with different rounding modes for the respective lanes so that each lane can generate a rounded value for the corresponding result data element using a different rounding mode. Each control field of the predicate register VP may include a rounding mode field 46 which specifies a lane rounding mode value LRM which identifies the rounding mode to be used for that lane. The processing unit 40 in each lane may have rounding circuitry 48 which is responsive to the lane rounding mode value LRM to generate a rounding increment in accordance with the specified rounding mode. For example, the lane rounding mode value LRM may control the way in which the L, G and S bits calculated in a floating-point operation are mapped to the rounding increment, as shown in Tables 4 or 5 above. The rounding increment can be added to the result of that lane, or used for injection rounding, to generate a result value using the rounding mode specified for that lane. Hence, as shown in FIG. 2 for each active lane the rounding is performed in accordance with a corresponding rounding mode value LRM, so that the rounding mode in each lane may be independently controlled. The mapping of the bits of the lane rounding mode value LRM to respective rounding modes is arbitrary and can be selected based on the particular needs for a given circuit implementation. Not all the rounding modes discussed in Table 3 above need be supported, and some other rounding modes could also be supported.

The floating point control register specifying the default rounding mode value 44 may be optional and in some cases the rounding mode to be used by each lane may be specified entirely by the corresponding lane rounding mode value LRM in the predicate register VP. Other embodiments may still provide the default rounding mode value 44 in the floating point control register 42. When the lane rounding mode value LRM for a particular vector lane has a default value (such as zero for example) then the rounding mode indicated in the floating point control register 42 may be used for that lane. If the lane rounding mode has a value other than the default value then specific rounding modes may be selected for that lane which may be different from other lanes. This approach may be useful for compatibility with legacy programs which may have been written assuming that the floating point control register 42 will specify the rounding mode for each lane. Such programs can still be executed as normal, while programs written with the lane-specific rounding in mind can exploit the new functionality of indicating the rounding mode separately for each lane in the predicate register. Providing the default rounding mode option in the floating point control register may also be useful if the bit space available in the predicate register for encoding the lane rounding mode value LRM has fewer bits than would be required to represent all the possible rounding mode supported in hardware. In this case than lane rounding mode encodings may be allocated to a subset of the rounding modes which are expected to be used most often on a lane by lane basis, with other rounding modes being available only for selection for the vector as a whole using the rounding mode specifying value 44 in the floating point control register 42.

As shown in FIG. 4, by supporting different rounding modes for each lane then the operation shown in example of FIG. 3 can be performed with fewer instructions. A first instruction (SET) may set the predicate register VP so that the lane rounding mode values in fields 46 indicate different rounding modes for each lane. A vector add instruction (VFADD) may then add two vectors with each lane using the rounding mode indicated by the corresponding field of the predicate register. In this example, two instructions are sufficient to calculate the same result as eight instructions in FIG. 3. Hence, a great performance improvement, power saving, and reduction in code storage can be achieved, without requiring extra encoding space to indicate each rounding mode explicitly in the instruction. This can be provided with relatively little increase in hardware, since each lane may already have circuitry for generating the rounding increment based on the L, G, S bits using the different rounding modes as explained above, but some additional control circuitry could be provided to configure the rounding circuitry within each lane independently from other lanes so as to generate the rounding increment according to the rounding mode specified for that lane. Therefore, a significant improvement in performance and power consumption can be achieved with little additional circuitry.

While FIG. 2 shows an example in which the lane rounding mode control information is specified in the same predicate register as the mask information, other examples may represent the rounding control information in different ways, e.g. in a different register from the mask information. However, some vector processing systems may already have a predicate register specifying such mask information which may in some cases have spare bits which are unused. For example this may be because the mask information is stored in a register of a fixed size but there are fewer data elements in a vector than there are bits in the register. In this case the spare bits of the predicate register can be reused for indicating the lane rounding mode information, so that there is no need for any additional register space. In this type of system, it may be expected that the unused bits of the predicate register should be 0, so the value of 0 for the lane rounding mode may be selected as the default value which causes that lane to operate in accordance with the default rounding mode specified in the floating point control register 42. This enables the system to process legacy code with the same functionality as existing systems, while newer code may exploit the added functionality of providing different rounding modes for each lane.

Not all instructions may require per-lane rounding. For some instructions there may not be any need for any rounding at all or it may be sufficient to perform rounding of each data element using the same rounding mode. For these instructions the lane rounding mode field 46 could be reused for indicating other types of information. For example, while for floating-point vector instructions the fields 46 may indicate the lane rounding mode values LRM, for integer instructions these fields 46 may provide other information which is differentiated on a per-lane basis.

For example, for some arithmetic instructions, the control fields 46 may indicate whether each lane should generate result in accordance with saturating arithmetic or non-saturating arithmetic. For the lanes indicated as using saturating arithmetic, if a processing result has a value which is larger than the maximum value represented by the result data element or smaller than the minimum value represented by that result data element, then the result data element may be set to the maximum or minimum value respectively. For non-saturating arithmetic, if a result exceeds a maximum value of the result data element then it may wrap around and be set to a value at the lower end of the significance represented by that result data element, and an overflow flag be set. Similarly, for an underflow with non-saturating arithmetic, a value may be generated which actually represents a larger value but an under flow flag may be set. By providing the ability to select these different types of operations on a per-lane basis, this may allow a given set of operations to be executed more quickly using a single vector instruction than in previous systems, in a similar way to the example of FIGS. 3 and 4.

The control fields 46 could also be used for some instructions to indicate which portion of a processing result should be represented by the corresponding result data element. For example, a multiplication instruction may generate a product which is larger than can fit in the result data element for a given lane. While some instructions might round this to a value that is representable in the result data element, other instructions may indicate only a portion of the result in the result data element. The control field 46 could be used to indicate which portion should be represented by the result data element. For example, the product would typically be twice as wide as the input element and so a bit in the control field 46 may select whether that lane generates the upper half or lower half of the product. If adjacent lanes are provided with the same pair of inputs and control information specifying the opposite halves of the product, then this can result in the adjacent lanes generating two data elements which together represent the entire product (with the upper element representing the upper half of the product and the lower element representing the lower half). This may be useful for data element size conversion so that the result vector may effectively have data elements which are twice as large as the input vectors.

Also, the control fields could be used to indicate which particular arithmetic operation to apply in each lane for a given arithmetic instruction. For example, the control fields could include a flag indicating whether corresponding elements of the input vectors V1, V2 are to be added or subtracted, so that some lanes may perform additions and other lanes may perform subtractions in response to a single instruction. For those lanes carrying out subtractions, the data element of one of the input vectors (e.g. V2) may be inverted and then added to the data element of the other vector (e.g. V1) while a carry input is asserted, to give the same result as a subtraction, while for lanes carrying out additions the corresponding data elements may simply be added without an inversion and without asserting the carry input.

While FIG. 2 shows an example in which each lane of processing has a separate control field specifying the type of arithmetic operation to be performed for that lane, it will be appreciated that this is not essential, and other examples may specify separate types of arithmetic operation only for some of the lanes. For example, the four lanes shown in FIG. 2 could be divided into two subsets, so that lanes 0 and 1 perform one type of operation as indicated by a first control field of the predicate register VP, and lanes 2 and 3 perform another type of operation as indicated by a second control field of the predicate register VP.

While FIG. 2 shows an example where the vectors include four data elements each, and there are four processing units 40 so that each element can be processed in parallel, this is not essential. Some systems may support vectors which are larger than the number of lanes provided in hardware. For example, if the input vectors have more than four data elements, they can be processed in several passes of the processing units 40 with each pass processing four of the data elements. The end result vector may then be assembled from the result data elements generated in each pass. In some cases, when the vector size is longer than the number of lanes provided in hardware, the vectors may be stored across multiple registers of the register bank 10.

Some systems may also support vectors with different sizes of data elements. For example, a 64-bit vector could be divided into a single 64-data element, two 32-bit data elements, four 16-bit data elements, or eight 8-bit data elements. In this case, the predicate register VP could also indicate the data element size for the current operation. The processing unit may have a number of processing units of fixed size, with each vector lane 40 indicated in FIG. 2 comprising one or more of these processing units depending on the data element size currently selected.

Also, it is not essential for the processing circuitry to have parallel processing units for processing multiple lanes of processing in parallel. In some systems, the vector processing circuitry 16 may comprise a single processing unit which performs one lane at a time, with each lane having a different rounding mode.

Figure 5:
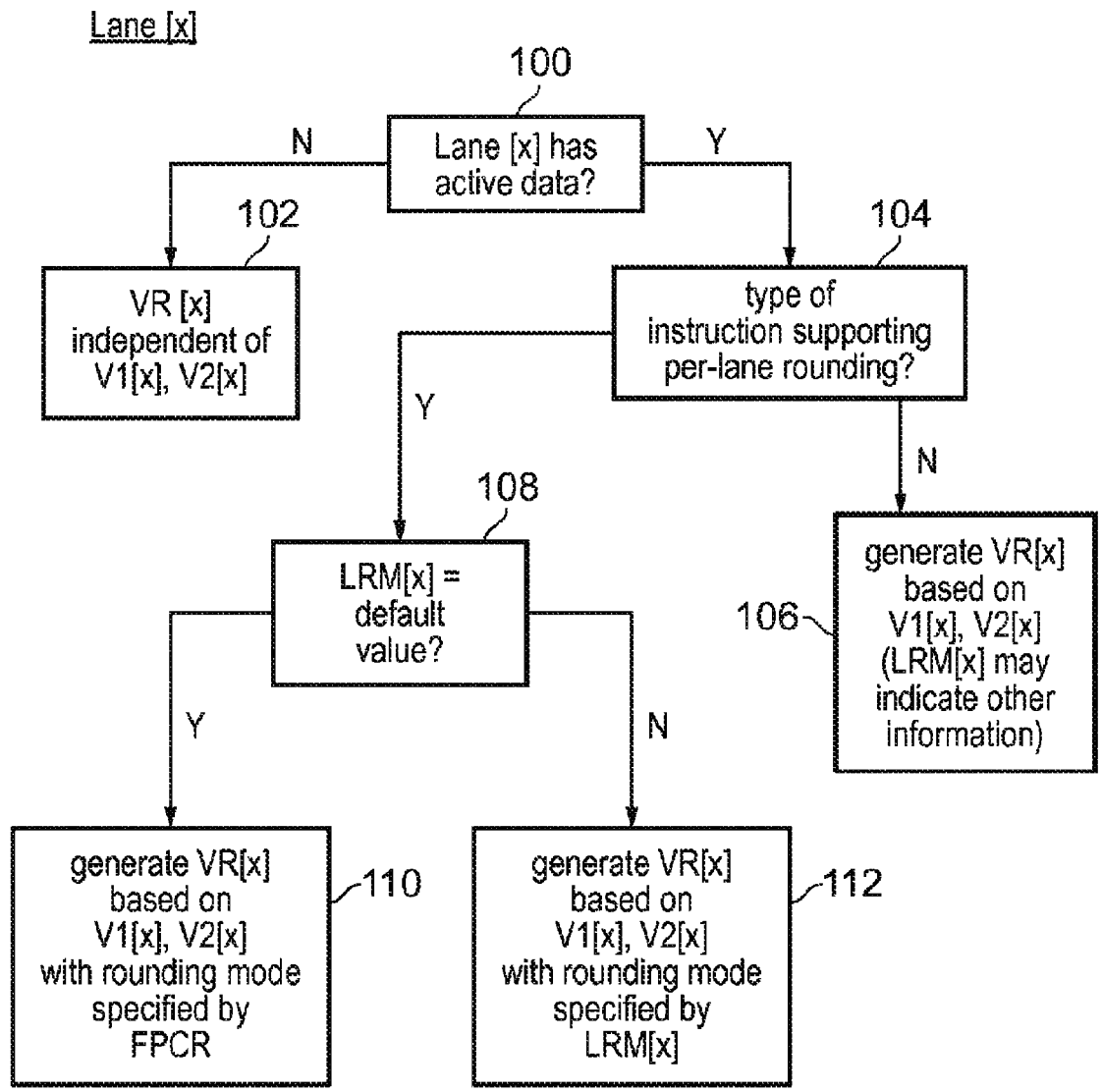
FIG. 5 shows a method of obtaining a result data element for a lane of processing.

FIG. 5 shows an example of a method of generating a result element for a particular lane of processing. It will be appreciated that these steps can be performed for each lane, either sequentially or in parallel with several lanes processed at once. At step 100 it is determined whether the current lane (referred to with an index x) has active data. If the mask bit M[x] for this lane is 1 then the lane has active data, while if M[x] is 0 then the lane does not have active data. If the data for lane x is inactive, then at step 102 the result data element VR[x] for that lane is generated independently of the corresponding data elements V1[x], V2[x]. For example, VR[x] may be set to a default value or may simply retain the same value that is already stored in the corresponding portion of the destination register.

For an active lane, at step 104 it is determined whether the current vector instruction is a type of instruction that supports per-lane rounding. If not then at step 106 the result data element VR[x] for this lane is generated in dependence on the corresponding elements of the input vectors V1[x], V2[x]. If the current operation requires some rounding then this may be performed in accordance with the rounding mode indicated in the floating point control register 42. The lane rounding mode field 46 may provide other information which influences the processing of this lane is some way, such as the information indicating whether saturating arithmetic is used, indicating the significance of the result to be generated, or indicating the type of arithmetic operation to be performed.

If the current-instruction does support per-lane rounding then at step 108 it is determined whether the lane rounding mode value LRM[x] for this lane has the default value. If so, then at step 110 the result data element VR[x] is generated based on the corresponding data elements V1[x], V2[x], using the rounding mode which is specified by the floating-point control register 42. However, unlike step 106 in step 110 it is possible that this rounding mode may differ from the rounding mode used by other lanes. On the other hand, if the lane rounding mode value LRM[x] does not have the default value, then at step 112 the result data element VR[x] for this lane is generated based on the corresponding elements V1[x], V2[x] using the rounding mode that is specified by the lane rounding mode value LRN[x].

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An apparatus comprising:
processing circuitry to perform, in response to a vector instruction, a plurality of lanes of processing on respective data elements of at least one operand vector to generate corresponding result data elements of a result vector;
wherein the processing circuitry supports performing at least two of said plurality of lanes of processing with different rounding modes for generating rounded values for the corresponding result data elements of the result vector;
a first control storage location to store a variable rounding mode parameter indicating a default rounding mode; and
a second control storage location comprising a plurality of control fields each for storing control information for controlling a corresponding lane of processing;
wherein for at least one type of vector instruction, the control information includes a rounding mode value specifying the rounding mode to be used for the corresponding lane of processing;
each control field includes information identifying whether the corresponding lane of processing is as an active lane for which the corresponding result data element is to be generated in dependence on said corresponding data element of the at least one operand vector, or an inactive lane for which the corresponding result data element of the result vector is independent of the corresponding data element of the at least one operand vector; and
in response to said at least one type of vector instruction:
when the rounding mode value stored in the second control storage location corresponding to a given lane of processing has a default value, the processing circuitry is to perform said given lane of processing using the default rounding mode indicated by the variable rounding mode parameter stored in the first control storage location; and
when the rounding mode value stored in the second control storage location corresponding to said given lane of processing has a value other than said default value, the processing circuitry is to perform said given lane of processing using the rounding mode indicated by said rounding mode value stored in the second control storage location corresponding to said given lane of processing.

2. The apparatus according to claim 1, wherein the processing circuitry supports performing said at least two of said plurality of lanes of processing with different rounding modes at least when processing a floating-point vector instruction.

3. The apparatus according to claim 1, wherein the processing circuitry comprises rounding circuitry to generate a rounding increment for each lane in dependence on the rounding mode specified by the rounding mode value for the corresponding lane of processing.

4. The apparatus according to claim 1, wherein each control field includes a rounding field for indicating the rounding mode value for the corresponding lane of processing; and
for at least one other type of vector instruction, the rounding field specifies information other than the rounding mode value.

5. The apparatus according to claim 4, wherein said information other than the rounding mode value is indicative of at least one of:
a type of arithmetic or logical operation to be performed for the corresponding lane of processing;
whether the corresponding lane of processing is to generate the result data element with saturating or non-saturating arithmetic; and
which portion of a result of the corresponding lane of processing is to be represented by the corresponding result data element.

6. The apparatus according to claim 1, wherein the processing circuitry comprises a plurality of processing units to perform at least some of said plurality of lanes of processing in parallel.

7. The apparatus according to claim 6, wherein the processing circuitry comprises M processing units, where M >1, and if the vector instruction requires more than M lanes of processing, then the processing circuitry is configured to perform the plurality of lanes of processing in multiple passes of said processing units.

8. An apparatus comprising:
processing means for performing, in response to a vector instruction, a plurality of lanes of processing on respective data elements of at least one operand vector to generate corresponding result data elements of a result vector;
wherein the processing means supports performing at least two of said plurality of lanes of processing with different rounding modes for generating rounded values for the corresponding result data elements of the result vector;
first means for storing a variable rounding mode parameter indicating a default rounding mode; and
second means for storing a plurality of control fields comprising control information for controlling a corresponding lane of processing;
wherein for at least one type of vector instruction, the control information includes a rounding mode value specifying the rounding mode to be used for the corresponding lane of processing; and
each control field includes information identifying whether the corresponding lane of processing is as an active lane for which the corresponding result data element is to be generated in dependence on said corresponding data element of the at least one operand vector, or an inactive lane for which the corresponding result data element of the result vector is independent of the corresponding data element of the at least one operand vector; and
in response to said at least one type of vector instruction:
when the rounding mode value stored in the second means for storing corresponding to a given lane of processing has a default value, the processing means is to perform said given lane of processing using the default rounding mode indicated by the variable rounding mode parameter stored in the first means for storing; and
when the rounding mode value stored in the second means for storing corresponding to said given lane of processing has a value other than said default value, the processing means is to perform said given lane of processing using the rounding mode indicated by said rounding mode value stored in the second means for storing corresponding to said given lane of processing.

9. A data processing method comprising:
performing, in response to a vector instruction, a plurality of lanes of processing on respective data elements of at least one operand vector to generate corresponding result data elements of a result vector;
wherein at least two of said plurality of lanes of processing are performed with different rounding modes for generating rounded values for the corresponding result data elements of the result vector;
wherein a first control storage location stores a variable rounding mode parameter indicating a default rounding mode;
a second control storage location comprises a plurality of control fields each for storing control information for controlling a corresponding lane of processing;
for at least one type of vector instruction, the control information includes a rounding mode value specifying the rounding mode to be used for the corresponding lane of processing; and
each control field includes information identifying whether the corresponding lane of processing is as an active lane for which the corresponding result data element is to be generated in dependence on said corresponding data element of the at least one operand vector, or an inactive lane for which the corresponding result data element of the result vector is independent of the corresponding data element of the at least one operand vector; and
in response to said at least one type of vector instruction:
when the rounding mode value stored in the second control storage location corresponding to a given lane of processing has a default value, the processing circuitry is to perform said given lane of processing using the default rounding mode indicated by the variable rounding mode parameter stored in the first control storage location; and
when the rounding mode value stored in the second control storage location corresponding to said given lane of processing has a value other than said default value, the processing circuitry is to perform said given lane of processing using the rounding mode indicated by said rounding mode value stored in the second control storage location corresponding to said given lane of processing.

* * * * *